US009779680B2

(12) United States Patent
Hao et al.

(10) Patent No.: US 9,779,680 B2
(45) Date of Patent: Oct. 3, 2017

(54) SHIFT REGISTER UNIT, GATE DRIVING CIRCUIT AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xueguang Hao, Beijing (CN); Seong Jun An, Beijing (CN); Bongyeol Ryu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 273 days.

(21) Appl. No.: 14/381,520

(22) PCT Filed: Nov. 12, 2013

(86) PCT No.: PCT/CN2013/086904
§ 371 (c)(1),
(2) Date: Aug. 27, 2014

(87) PCT Pub. No.: WO2015/003444
PCT Pub. Date: Jan. 15, 2015

(65) Prior Publication Data
US 2016/0232865 A1    Aug. 11, 2016

(30) Foreign Application Priority Data

Jul. 10, 2013 (CN) .......................... 2013 1 0288984

(51) Int. Cl.
*G09G 3/36* (2006.01)
*G11C 19/28* (2006.01)

(52) U.S. Cl.
CPC ......... *G09G 3/3677* (2013.01); *G09G 3/3688* (2013.01); *G09G 3/3696* (2013.01);
(Continued)

(58) Field of Classification Search
None
See application file for complete search history.

(56) References Cited

U.S. PATENT DOCUMENTS 9,203,395 B2 * 12/2015 Kim ...................... G09G 3/3677
2006/0022201 A1 * 2/2006 Kim ...................... G02F 1/1339
257/72

(Continued)

FOREIGN PATENT DOCUMENTS

CN    102656384 A    8/2012
CN    102682699 A    9/2012
(Continued)

OTHER PUBLICATIONS

International Preliminary Report on Patentability Appln. No. PCT/CN2013/086904; dated Jan. 12, 2016.
(Continued)

*Primary Examiner* — Carolyn R Edwards
*Assistant Examiner* — Bipin Gyawali
(74) *Attorney, Agent, or Firm* — Ladas & Parry LLP (57) ABSTRACT

There are provided a shift register unit, a gate driving circuit and a display apparatus, which are configured to suppress interference noise due to a change of an alternating current clock signal and enhance stability of the shift register unit. The shift register unit comprises: an input module configured to charge a pull-up node in response to the input signal; a pull-down module configured to provide the low voltage signal to the pull-up node and the output terminal in response to a voltage signal of the pull-down node; a pull-down driving module configured to charge a pull-down
(Continued)

node in response to the first clock signal and the second clock signal and discharge the pull-down node in response to the voltage signal of the pull-up node; an output module configured to provide a first clock signal to an output terminal in response to a voltage signal of the pull-up node; and a reset module configured to discharge the output terminal in response to the second clock signal.

20 Claims, 4 Drawing Sheets

(52) U.S. Cl.
CPC ..... *G11C 19/28* (2013.01); *G09G 2300/0809* (2013.01); *G09G 2300/0842* (2013.01); *G09G 2310/0286* (2013.01)

(56) References Cited

U.S. PATENT DOCUMENTS

| | | | | |
|---|---|---|---|---|
| 2008/0219401 | A1* | 9/2008 | Tobita | G09G 3/3677 377/79 |
| 2010/0013823 | A1* | 1/2010 | Kwon | G09G 3/3674 345/214 |
| 2011/0058640 | A1* | 3/2011 | Shang | G11C 19/28 377/64 |
| 2012/0146978 | A1* | 6/2012 | Park | G11C 19/287 345/211 |
| 2014/0072093 | A1 | 3/2014 | Shang et al. | |
| 2014/0086379 | A1 | 3/2014 | Ma et al. | |
| 2014/0098015 | A1 | 4/2014 | Wang | |

FOREIGN PATENT DOCUMENTS

| | | |
|---|---|---|
| CN | 102708818 A | 10/2012 |
| CN | 102956213 A | 3/2013 |
| CN | 202838909 U | 3/2013 |
| CN | 202905121 U | 4/2013 |
| CN | 103151011 A | 6/2013 |
| CN | 103366704 A | 10/2013 |
| KR | 20130071438 A | 6/2013 |

OTHER PUBLICATIONS

Second Chinese Office Action Appln. No. 201310288984.3; dated Apr. 14, 2015
International Search Report Appln. No. PCT/CN2013/086904; dated Apr. 2, 2014.

\* cited by examiner

-Prior Art-

SHIFT REGISTER UNIT, GATE DRIVING CIRCUIT AND DISPLAY APPARATUS

TECHNICAL FIELD

The present disclosure relates to the field of liquid crystal display technique, specifically to a shift register unit, a gate driving circuit and a display apparatus.

BACKGROUND

A thin film transistor liquid crystal display (TFT-LCD) driver mainly comprises a gate driving circuit and a data driving circuit, wherein the gate driving circuit applies an input clock signal to a gate line of a liquid crystal display panel after having converted the input clock signal through a shift register unit, and the gate driving circuit can have the same process as the TFT and form together with the TFT on the LCD panel simultaneously. The gate driving circuit comprises shift register units having multiple stages, each of which is connected to a corresponding gate line to output a gate driving signal. Respective stages of gate driving circuit are connected with each other, and a start signal is input to a first stage of the respective stages and the gate driving signal is sequentially output to the gate line, wherein an input terminal of the present stage is connected to an output terminal of the previous stage, and an output terminal of the next stage is connected to a control terminal of the present stage.

Figure 1:
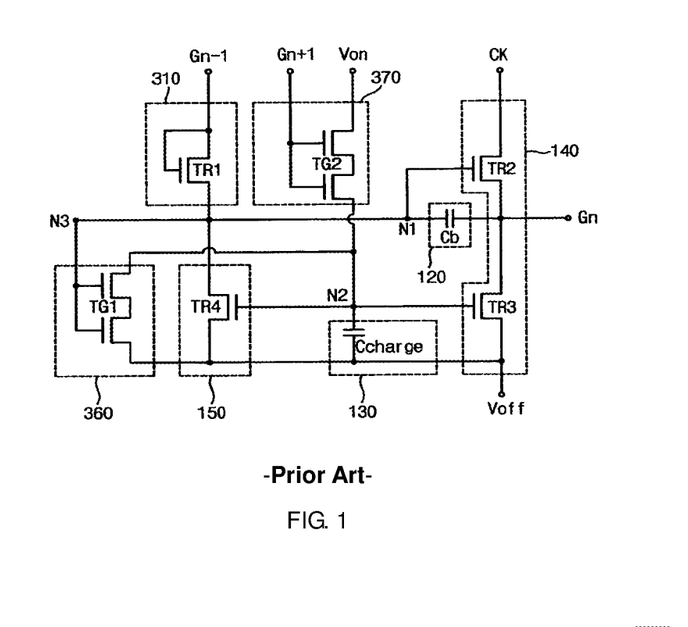
FIG. 1 is schematic diagram of a structure of a shift register unit known in the art.

The gate driving circuit of the above configuration is set on the LCD panel, and its each stage of shift register unit comprises the structure as shown in FIG. 1. However, the gate driving circuit composed of the shift register unit as shown in FIG. 1 is of high power consumption and easily causes noise. Besides, after the multiple stages are connected, the gate driving circuit needs up and down two virtual shift register units to operate normally. In general, the design structure and signal input of the two virtual shift register units differs from the structure of other shift register units in the circuit, and it is needed to add signal lines to provide signals for the virtual shift register units, which finds more difficulty in the wiring and increases the signal output of the gate driving circuit, thereby increasing the power consumption of the gate driving circuit.

SUMMARY

In order to solve the above technical problem, embodiments of the present disclosure provide a shift register unit, a gate driving circuit and a display apparatus, which are configured to suppress interference noise due to a change of an alternating current clock signal and enhance stability of the shift register unit.

A shift register unit according to an embodiment of the present disclosure comprises: an input module connected to an input signal terminal and configured to provide an input signal to a pull-up node in response to the input signal; an output module connected to a first clock signal terminal and configured to provide a first clock signal to an output terminal in response to a voltage signal of the pull-up node; a pull-down driving module connected to the first clock signal terminal and a second clock signal terminal and configured to provide a second clock signal to a pull-down node in response to the first clock signal and the second clock signal and provide a low voltage signal to the pull-down node in response to the voltage signal of the pull-up node; a pull-down module configured to provide the low voltage signal to the pull-up node and the output terminal in response to a voltage signal of the pull-down node; a reset module connected to the second clock signal terminal and configured to provide the low voltage signal to the output terminal in response to the second clock signal; wherein the pull-up node is a connecting point of the input module and the output module, and the pull-down node is a connecting point of the pull-down driving module and a pull-down-module.

According to an embodiment of the present disclosure, there is provided a gate driving circuit comprising respective stages of shift register units connected in cascade, wherein an input signal terminal of a first stage of shift register unit is connected to a start signal terminal, and except the first stage of shift register unit, input signal terminals of other respective stages of shift register units are connected to output terminals of previous stages of shift register units;

The shift register units connected in cascade are the shift register unit described above.

According to an embodiment of the present disclosure, there is further provided a display apparatus comprising the above gate driving circuit.

The shift register unit and the gate driving circuit of the embodiments of the present disclosure comprise: the input module configured to provide an input signal to a pull-up node in response to the input signal; the pull-down module configured to provide the low voltage signal to the pull-up node and the output terminal in response to a voltage signal of the pull-down node; the pull-down driving module configured to provide a second clock signal to a pull-down node in response to the first clock signal and the second clock signal and provide a low voltage signal to the pull-down node in response to the voltage signal of the pull-up node; the output module configured to provide a first clock signal to an output terminal in response to a voltage signal of the pull-up node; the reset module configured to provide the low voltage signal to the output terminal in response to the second clock signal. In this shift register unit, before the next frame is started, continuously discharging the pull-up node and the output terminal through the pull-down unit or the reset unit effectively avoids noise at the pull-up node and the output terminal from being produced; at the same time, each high level signal of the first clock signal and the second clock signal can pull up a potential at the pull-down node, thereby greatly reducing the power consumption of the whole circuit; in addition, in the gate driving circuit composed of the shift register units, it is not needed to set any virtual shift register unit, which effectively reduces the wiring space and further decreases the power consumption of the whole circuit.

DETAILED DESCRIPTION

Embodiments of the present disclosure provide a shift register unit, a gate driving circuit and a display apparatus, which are configured to suppress interference noise due to a change of an alternating current clock signal and enhance stability of the shift register unit.

The embodiments of the present disclosure will be described below in combination with the accompanying figures.

Figure 2:
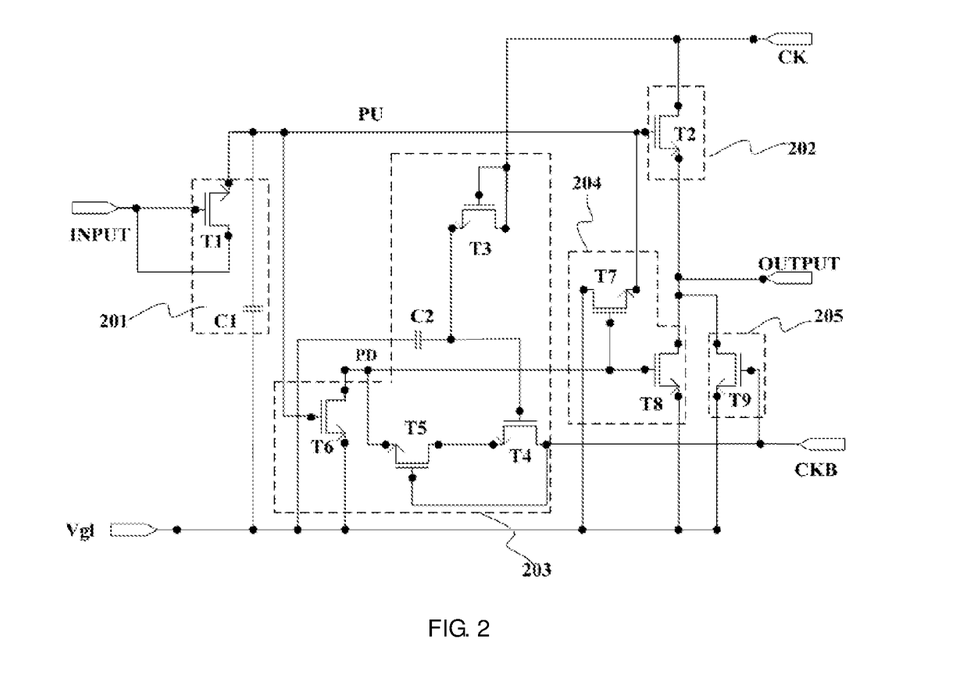
FIG. 2 is a schematic diagram of a structure of a shift register unit provided in a first embodiment of the present disclosure.

The first embodiment of the present disclosure provides a shift register unit, and its structure is as shown in FIG. 2. It can be seen from FIG. 2 that the shift register unit comprises: an input module 201, an output module 202, a pull-down driving module 203, a pull-down module 204 and a reset module 205.

The input module 201 is connected to an input signal terminal and configured to provide an input signal to a pull-up node in response to the input signal, the pull-up node being a connecting point of the input module and the output module.

The output module 202 is connected to a first clock signal terminal and configured to provide a first clock signal to an output terminal in response to a voltage signal of the pull-up node.

The pull-down driving module 203 is configured to provide a second clock signal to a pull-down node in response to the first clock signal and the second clock signal, and provide a low voltage signal to the pull-down node in response to the voltage signal of the pull-up node, the pull-down node being a connecting point of the pull-down driving module and a pull-down module.

The pull-down module 204 is configured to provide the low voltage signal to the pull-up node and the output terminal in response to a voltage signal of the pull-down node.

The reset module 205 is configured to provide the low voltage signal to the output terminal in response to the second clock signal.

The present disclosure will be described in detail in combination with specific embodiments. It is needed to specify that the present embodiment is used to explain the present disclosure to the better rather than limiting the present disclosure.

The shift register unit as shown in FIG. 2 comprises: the input module 201, the output module 202, the pull-down driving module 203, the pull-down module 204 and the reset module 205.

Specifically, the input module 201 comprises: a first thin film transistor T1, whose gate and drain are simultaneously connected to an input signal terminal INPUT, and source is connected to a pull-up node PU; a first capacitor C1 connected between the pull-up node PU and a low voltage signal Vgl.

The output module 202 comprises: a second thin film transistor T2, whose gate is connected to the pull-up node PU, drain is connected to a first clock signal CK, and source is connected to an output terminal OUTPUT.

The pull-down driving module 203 comprises: a third thin film transistor T3, whose gate and drain are simultaneously connected to the first clock signal CK, and source is connected to a gate of a fourth thin film transistor T4; the fourth thin film transistor T4, whose gate is connected to the source of the third thin film transistor T3, drain is connected to a second clock signal CKB, and source is connected to a drain of a fifth thin film transistor T5; the fifth thin film transistor T5, whose gate is connected to the second clock signal CKB, drain is connected to the source of the fourth thin film transistor T4, and source is connected to the pull-down node PD; a sixth thin film transistor T6, whose gate is connected to the pull-up node PU, drain is connected to the pull-down node PD, and source is connected to the low voltage signal Vgl; and a second capacitor C2 connected between the source of the third thin film transistor T3 and the low voltage signal Vgl.

The pull-down module 204 comprises: a seventh thin film transistor T7, whose gate is connected to the pull-down node PD, source is connected to the pull-up node PU, and drain is connected to the low voltage signal Vgl; an eighth thin film transistor T8, whose gate is connected to the pull-down PD, drain is connected to the output terminal OUTPUT, and source is connected to the low voltage signal Vgl.

The reset module 205 comprises: a ninth thin film transistor T9, whose gate is connected to the second clock signal CKB, drain is connected to the output terminal OUTPUT, and source is connected to the low voltage signal Vgl.

As an example, all of the above thin film transistors are N-type thin film transistors TFTs.

As an example, all of the above thin film transistors are polysilicon thin film transistors simultaneously, or amorphous silicon thin film transistors simultaneously.

Figure 3:
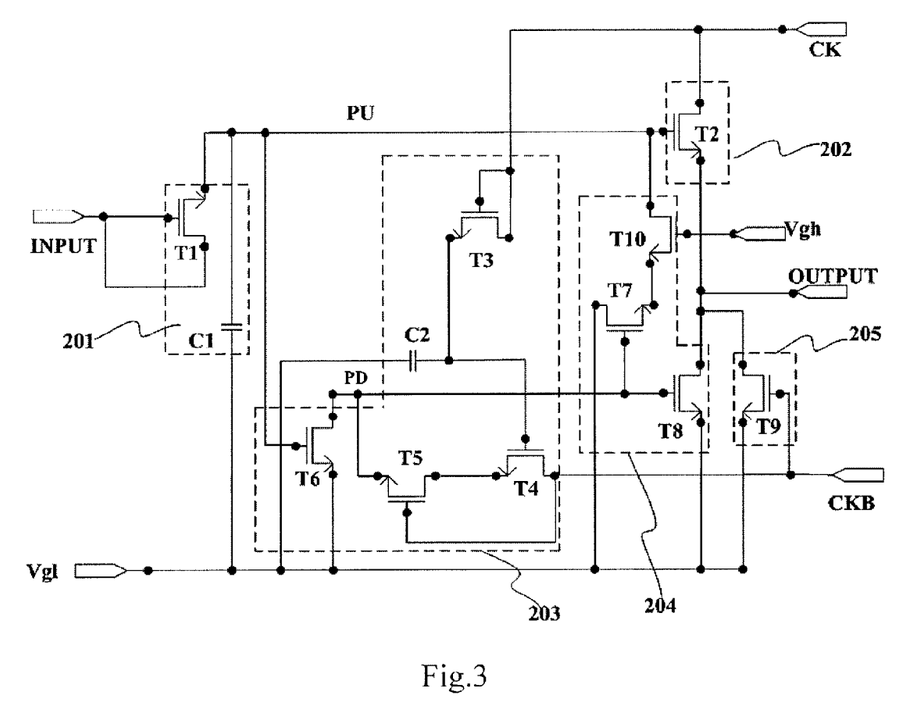
FIG. 3 is a schematic diagram of a structure of another shift register unit provided in a second embodiment of the present disclosure.

A second embodiment of the present disclosure provides another kind of shift register unit, and its structure is as shown in FIG. 3. It can be seen from FIG. 3 that the shift register unit also comprises: the input module 201, the output module 202, the pull-down driving module 203, the pull-down module 204 and the reset module 205;

The shift register unit as shown in FIG. 3 differs from the shift register unit as shown in FIG. 2 in that the pull-down module 204 of the shift register unit as shown in FIG. 3 further comprises a tenth thin film transistor T10 except for the seventh thin film transistor T7. Specifically, the tenth thin film transistor T10 has a gate connected to a high voltage signal Vgh, a drain connected to the pull-up node PU, and a source connected to the source of the seventh thin film transistor T7.

In the shift register unit as shown in FIG. 3, since the tenth thin film transistor T10 is set in the pull-down module 204, the tenth thin film transistor T10 can have a function of voltage dividing, such that the potential at the source of the seventh thin film transistor T7 is decreased, so as to further enable the voltage between the gate and source of the seventh thin film transistor T7 to be increased, and in this way it is easier for the seventh thin film transistor T7 to be turned on, thereby strengthening the discharging capability of the pull-down module 204 and greatly reducing noise at the pull-up node PU. Therefore, the shift register unit as shown in FIG. 3 is a further optimization of the shift register unit as shown in FIG. 2.

Figure 4:
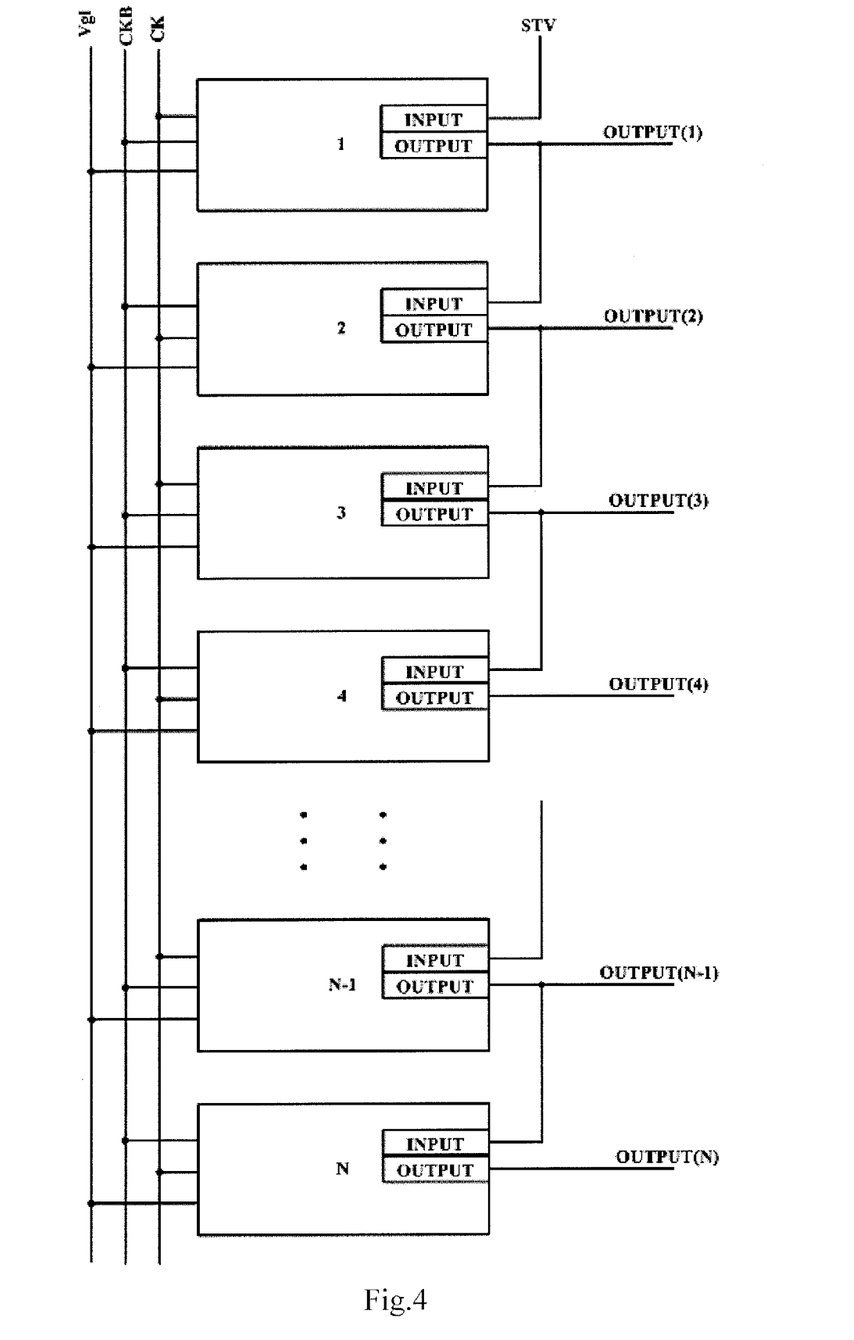
FIG. 4 is a schematic diagram of a structure of a gate driving circuit provided in a third embodiment of the present disclosure.

The above shift register units are connected in cascade to form an array substrate gate driving circuit. FIG. 4 shows a schematic diagram of a structure of a gate driving circuit according to a third embodiment of the present disclosure. The gate driving circuit comprises respective shift register units connected in cascade, wherein an input signal terminal of a first stage of shift register unit is connected to a start signal terminal, and except the first stage of shift register unit, input signal terminals of other respective stages of shift register units are connected to output terminals of previous stages of shift register units. All of the above shift register units connected in cascade are the shift register unit as shown in FIG. 2 or the shift register unit shown in FIG. 3.

Specifically, the array substrate gate driving circuit comprises N stages, wherein N is the number of gate lines. Referring to FIG. 4, a start signal STV is input as an input signal to the first stage of shift register unit, and the gate driving signals are sequentially output to the gate lines. An input signal of the n-th stage is provided by an output signal of the (n−1)-th stage, wherein n<N.

Figure 5:
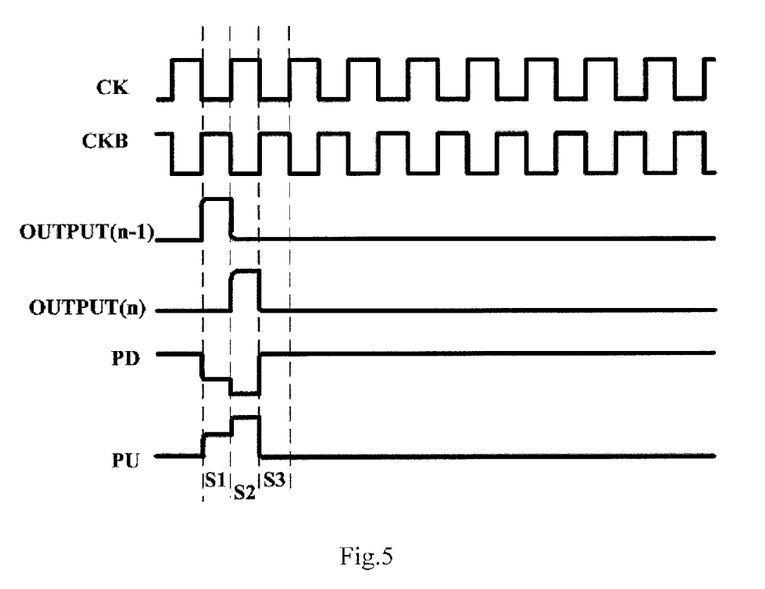
FIG. 5 is a timing signal diagram of respective signal terminals of a shift register unit provided in a fourth embodiment of the present disclosure.

FIG. 5 is a timing diagram of respective signal terminals of a shift register unit according to the embodiments of the present disclosure. The operating method of the n-th stage of shift register unit (n<N, and N is the number of stages of the array substrate gate circuit) in the array substrate gate driving circuit in the fourth embodiment of the present disclosure will be described below in combination with FIG. 5, wherein all of the shift register units are the shift register unit as shown in FIG. 2.

When the gate driving circuit scans, all of the TFTs are turned on at a high level and turned off at a low level; the first clock signal CK has a phase opposite to that of the second clock signal CKB. The operating principle of the above method will be described below by three phase S1, S2, S3.

In the first phase S1, the first clock signal CK is at the low level, the second clock signal CKB is at the high level, and the output signal of the previous stage OUTPUT(n−1) as the input signal of the n-th stage is at the high level;

The input signal OUTPUT(n−1) at the high level makes the first thin film transistor T1 turned on, and the input signal charges the first capacitor C1, so that the pull-up node PU is at the high level. At this time, the second thin film transistor T2 is turned on in response to the voltage signal of the pull-up node PU. However, since the first clock signal CK is at the low level, the output from the output terminal OUTPUT(n) is at the low level at this time;

At the same time, the sixth thin film transistor T6 is turned on in response to the voltage signal of the pull-up node PU, and the pull-down node PD is discharged through the sixth thin film transistor T6, so that the potential at the pull-down node PD is rapidly decreased, and the second thin film transistor T2 and the eighth thin film transistor T8 are turned off in response to the voltage signal of the pull-down node PD.

In the second phase S2, the first clock signal CK is at the high level, the second clock signal CKB is at the low level, and OUTPUT(n−1) as the input signal of the n-th stage is at the high level;

The input signal OUTPUT(n−1) is at the low level, so that the first thin film transistor T1 is turned off. However, since the existence of the first capacitor C1, the pull-up node PU is still maintained at the high potential, and at the same time, the first clock signal CLK is at the high level. Due to the bootstrapping of the capacitor C1, the potential at the pull-up node PU continues to rise, and the second thin film transistor T1 is kept in the turn-on state;

In the meantime, the sixth thin film transistor T6 is maintained to be turned on in response to the voltage signal of the pull-up node PU, and the pull-down node PD continues to be discharged through the sixth thin film transistor T6. At this time, the voltage at the pull-down node PD is further decreased, and the seventh thin film transistor T7 and the eighth thin film transistor T8 are maintained to be turned off in response to the voltage signal of the pull-down node PD; in addition, since the second clock signal CKB is at the low level, the ninth thin film transistor T9 and the fifth thin film transistor T5 are turned off in response to the second clock signal CKB.

Therefore, the output from the output terminal OUTPUT (n) is at the high level at this time.

In addition, the first clock level CK is at the high level, so that the third thin film transistor T3 is turned on, and the fourth thin film transistor T4 is turned on; at the same time, the first clock signal CK charges the second capacitor C2.

In the third phase S3, the first clock signal CK is at the low level, the second clock signal CKB is at the high level, and the output signal of the previous stage OUTPUT(n−1) as the input signal of the n-th stage is at the low level.

The first clock signal CK is at the low level, so that the second thin film transistor T2 is turned off and the third thin film transistor T3 is turned off; however, due to the existence of the second capacitor C2, the gate of the fourth thin film transistor T4 is maintained at the high potential, and the fourth thin film transistor T4 is continuously turned on.

The second clock signal CKB is at the high level, so that the fifth thin film transistor T5 and the ninth thin film transistor T9 are turned on, and the output terminal OUTPUT is discharged through the ninth thin film transistor T9, so as to make the output terminal OUTPUT(n) rapidly decrease to the low level;

Therefore, the output from the output terminal OUTPUT (n) is at the low level at this time.

In the meantime, the second clock signal CKB charges the pull-down node PD through the fourth thin film transistor T4 and the fifth thin film transistor T5, so that the seventh thin film transistor T7 and the eighth thin film transistor T8 are turned on in response to the voltage signal of the pull-down node PD. The pull-up node PU is discharged through the seventh thin film transistor T7, so that the pull-up node PU is rapidly decreased to the low level. At the same time, the output terminal OUTPUT is discharged through the eighth thin film transistor T8. In this way, the interference noise caused by the change of the alternating current clock signal can be eliminated to ensure the stability of the output signal.

In the above gate driving circuit, the potential at the pull-up node PU is pulled down through the seventh thin film transistor T7, and before the next frame is started, the seventh thin film transistor T7 is always maintained in the turn-on state, thereby effectively avoiding noise at the pull-up node PU from being produced; the output terminal OUTPUT is discharged though the eighth thin film transistor T8 and the ninth thin film transistor T9, thereby effectively avoiding the introduction of noise at the output terminal; by using the second capacitor C2, each high level signal of the first clock signal CK and the second clock signal CKB can pull up the potential at the pull-down node, thereby reducing the power consumption of the whole circuit and avoiding the introduction of noise at the pull-down node PD; in the meantime, in the gate driving circuit, by an arrangement of the whole devices and a flexible combination of signals, the same shift register unit is adopted in the whole gate driving circuit, which greatly reduces the difficulty in the wiring of the gate driving circuit.

When the shift register unit in the gate driving circuit is the shift register unit as shown in FIG. 3, its operation principle is the same as that of the gate driving circuit composed of the shift register unit as shown in FIG. 2. However, since the tenth thin film transistor T10 is set in FIG. 3, the tenth thin film transistor T10 can have a function of voltage dividing, such that the voltage at the gate and source of the seventh thin film transistor T7 is increased, and it is easier for the seventh thin film transistor T7 to be turned on, thereby facilitating to reduce the noise at the pull-up node PU, further strengthening the noise reduction capability of the shift register unit and enhancing the stability of the shift register unit.

In summary, there are provided the shirt register unit and the gate driving circuit according to the embodiments of the present disclosure, the shift register unit of comprises: the input module configured to provide an input signal to a pull-up node in response to the input signal; a pull-down module configured to provide the low voltage signal to the pull-up node and the output terminal in response to a voltage signal of the pull-down node; the pull-down driving module configured to provide a second clock signal to a pull-down node in response to the first clock signal and the second clock signal and provide a low voltage signal to the pull-down node in response to the voltage signal of the pull-up node; the output module configured to provide a first clock signal to an output terminal in response to a voltage signal of the pull-up node; the reset module configured to provide the low voltage signal to the output terminal in response to the second clock signal. In this shift register unit, the potential at the pull-up node PU is pulled down through the pull-down unit, and before the next frame is started, the pull-down unit is always maintained in the operating state, thereby effectively avoiding the noise at the pull-up node from being produced; the output terminal is continuously discharged through the pull-down unit and the reset unit, thereby effectively avoiding the noise at the output terminal from being generated; by using the pull-down driving unit, each high level signal of the first clock signal and the second clock signal can pull up the potential at the pull-down node, thereby reducing the power consumption of the whole circuit and avoiding the noise at the pull-down node from being produced; therefore, in the gate driving circuit composed of the above shift register unit, through an arrangement of the whole device and a flexible combination of signals, the same shift register unit is adopted in the whole gate driving circuit, which greatly reduces the difficulty in the wiring of the gate driving circuit.

The embodiments of the present disclosure further provide a display apparatus comprising the gate driving circuit provided in the embodiments of the present disclosure. The display apparatus may be any product or elements having a display function such as a liquid crystal panel, an electronic paper, an OLED panel, a mobile phone, a tablet computer, a TV set, a display, a notebook computer, a digital photo frame, a navigator, etc.

Obviously, those skilled in the art can make various alternations and modifications to the present disclosure without departing from the spirit and scope of the present disclosure. As such, if these alternations and modifications fall into a scope of the claims of the present disclosure and their equivalent technologies, the present disclosure intends to include these alternations and modifications.

What is claimed is:

1. A shift register unit, comprising:
an input module connected to an input signal terminal and configured to provide an input signal to a pull-up node in response to the input signal;
an output module connected to a first clock signal terminal and configured to provide a first clock signal to an output terminal in response to a voltage signal of the pull-up node;
a pull-down driving module connected directly to the first clock signal terminal and a second clock signal terminal, and configured to provide a second clock signal which is a periodic pulse signal to a pull-down node in response to the first clock signal and the second clock signal and provide a low voltage signal to the pull-down node in response to the voltage signal of the pull-up node;
a pull-down module configured to provide the low voltage signal to the pull-up node and the output terminal in response to a voltage signal of the pull-down node; and
a reset module connected to the second clock signal terminal and configured to provide the low-voltage signal to the output terminal in response to the second clock signal,
wherein the pull-up node is a connecting point of the input module and the output module, and the pull-down node is a connecting point of the pull-down driving module and a the pull-down module.

2. The shift register unit according to claim 1, wherein the input module comprises:
a first thin film transistor, whose gate and drain are simultaneously connected to an input signal terminal, and source is connected to a pull-up node; and
a first capacitor connected between the pull-up node and a low voltage signal terminal.

3. The shift register unit according to claim 1, wherein the output module comprises:
a second thin film transistor, whose gate is connected to the pull-up node, drain is connected to the first clock signal, and source is connected to the output terminal.

4. The shift register unit according to claim 1, wherein the pull-down driving module comprises:
a third thin film transistor, whose gate and drain are simultaneously connected to the first clock signal, and source is connected to a gate of a fourth thin film transistor;
the fourth thin film transistor, whose gate is connected to the source of the third thin film transistor, drain is connected to the second clock signal, and source is connected to a drain of a fifth thin film transistor;
the fifth thin film transistor, whose gate is connected to the second clock signal, drain is connected to the source of the fourth thin film transistor, and source is connected to the pull-down node;
a sixth thin film transistor, whose gate is connected to the pull-up node, drain is connected to the pull-down node, and source is connected to the low voltage signal terminal; and
a second capacitor connected between the source of the third thin film transistor and a low voltage signal terminal.

5. The shift register unit according to claim 1, wherein the pull-down module comprises:
a seventh thin film transistor, whose gate is connected to the pull-down node, source is connected to the pull-up node, and drain is connected to the low voltage signal terminal;
an eighth thin film transistor, whose gate is connected to the pull-down node, drain is connected to the output terminal, and source is connected to the low voltage signal terminal.

6. The shift register unit according to claim 1, wherein the reset module comprises:
a ninth thin film transistor, whose gate is connected to the second clock signal, drain is connected to the output terminal, and source is connected to the low voltage signal terminal.

7. The shift register unit according to claim 1, wherein all of the thin film transistors are N-type thin film transistors.

8. The shift register unit according to claim 7, wherein all of the thin film transistors are polysilicon thin film transistors, or amorphous thin film transistors, or oxide thin film transistors.

9. A gate driving circuit comprising respective stages of shift register units connected in cascade, wherein an input signal terminal of a first stage of shift register unit is connected to a start signal terminal, and except the first stage of shift register unit, input signal terminals of other respective stages of shift register units are connected to output terminals of previous stages of shift register units;

wherein all of the shift register units connected in cascade are the shift register unit according to claim 1.

10. An display apparatus comprising the gate driving circuit according to claim 9.

11. The shift register unit according to claim 2, wherein the output module comprises:

a second thin film transistor, whose gate is connected to the pull-up node, drain is connected to the first clock signal, and source is connected to the output terminal.

12. The shift register unit according to claim 11, wherein the pull-down driving module comprises:

a third thin film transistor, whose gate and drain are simultaneously connected to the first clock signal, and source is connected to a gate of a fourth thin film transistor;

the fourth thin film transistor, whose gate is connected to the source of the third thin film transistor, drain is connected to the second clock signal, and source is connected to a drain of a fifth thin film transistor;

the fifth thin film transistor, whose gate is connected to the second clock signal, drain is connected to the source of the fourth thin film transistor, and source is connected to the pull-down node;

a sixth thin film transistor, whose gate is connected to the pull-up node, drain is connected to the pull-down node, and source is connected to a low voltage signal terminal; and a second capacitor connected between the source of the third thin film transistor and the low voltage signal terminal.

13. The shift register unit according to claim 12, wherein the pull-down module comprises:

a seventh thin film transistor, whose gate is connected to the pull-down node, source is connected to the pull-up node, and drain is connected to the low voltage signal terminal;

an eighth thin film transistor, whose gate is connected to the pull-down node, drain is connected to the output terminal, and source is connected to the low voltage signal terminal.

14. The shift register unit according to claim 13, wherein the reset module comprises:

a ninth thin film transistor, whose gate is connected to the second clock signal, drain is connected to the output terminal, and source is connected to the low voltage signal terminal.

15. The shift register unit according to claim 14, wherein all of the thin film transistors are N-type thin film transistors.

16. The gate driving circuit according to claim 9, wherein the input module comprises:

a first thin film transistor, whose gate and drain are simultaneously connected to an input signal terminal, and source is connected to a pull-up node; and a first capacitor connected between the pull-up node and a low voltage signal terminal.

17. The gate driving circuit according to claim 9, wherein the output module comprises:

a second thin film transistor, whose gate is connected to the pull-up node, drain is connected to the first clock signal, and source is connected to the output terminal.

18. The gate driving circuit according to claim 9, wherein the pull-down driving module comprises:

a third thin film transistor, whose gate and drain are simultaneously connected to the first clock signal, and source is connected to a gate of a fourth thin film transistor;

the fourth thin film transistor, whose gate is connected to the source of the third thin film transistor, drain is connected to the second clock signal, and source is connected to a drain of a fifth thin film transistor;

the fifth thin film transistor, whose gate is connected to the second clock signal, drain is connected to the source of the fourth thin film transistor, and source is connected to the pull-down node;

a sixth thin film transistor, whose gate is connected to the pull-up node, drain is connected to the pull-down node, and source is connected to a low voltage signal terminal; and a second capacitor connected between the source of the third thin film transistor and the low voltage signal terminal.

19. The gate driving circuit according to claim 9, wherein the pull-down module comprises:

a seventh thin film transistor, whose gate is connected to the pull-down node, source is connected to the pull-up node, and drain is connected to the low voltage signal terminal;

an eighth thin film transistor, whose gate is connected to the pull-down node, drain is connected to the output terminal, and source is connected to the low voltage signal terminal.

20. The gate driving circuit according to claim 9, wherein the reset module comprises:

a ninth thin film transistor, whose gate is connected to the second clock signal, drain is connected to the output terminal, and source is connected to the low voltage signal terminal.

* * * * *